(12) United States Patent
Harrison

(10) Patent No.: US 8,217,372 B2
(45) Date of Patent: Jul. 10, 2012

(54) GAS-CLUSTER-JET GENERATOR AND GAS-CLUSTER ION-BEAM APPARATUS UTILIZING AN IMPROVED GAS-CLUSTER-JET GENERATOR

(75) Inventor: Stanley Harrison, Bethlehem, NH (US)

(73) Assignee: Exogenesis Corporation, Billerica, MA (US)

( * ) Notice: Subject to any disclaimer, the term of this patent is extended or adjusted under 35 U.S.C. 154(b) by 109 days.

(21) Appl. No.: 12/825,504

(22) Filed: Jun. 29, 2010

(65) Prior Publication Data

US 2011/0155897 A1  Jun. 30, 2011

Related U.S. Application Data

(60) Provisional application No. 61/221,720, filed on Jun. 30, 2009.

(51) Int. Cl.
- *H01J 37/08* (2006.01)
- *H01J 37/317* (2006.01)
- *G21K 5/10* (2006.01)

(52) U.S. Cl. .............. 250/492.22; 250/281; 250/282; 250/288; 250/423 R; 250/424; 250/492.1; 250/492.2; 250/432 R

(58) Field of Classification Search ........... 250/281, 250/282, 288, 423 R, 424, 425, 432 R, 492.1, 250/492.2, 492.22
See application file for complete search history.

(56) References Cited

U.S. PATENT DOCUMENTS

| | | | |
|---|---|---|---|
| 4,358,302 A | 11/1982 | Dahneke | |
| 6,486,478 B1 * | 11/2002 | Libby et al. | 250/492.1 |
| 6,635,883 B2 * | 10/2003 | Torti et al. | 250/423 R |
| 6,676,989 B2 * | 1/2004 | Kirkpatrick et al. | 427/2.28 |
| 6,750,460 B2 * | 6/2004 | Greer | 250/492.2 |
| 6,797,942 B2 | 9/2004 | Grier et al. | |
| 7,173,252 B2 * | 2/2007 | Mack | 250/423 R |
| 7,439,492 B1 | 10/2008 | Ice | |
| 7,547,899 B2 | 6/2009 | Vanderpot et al. | |
| 7,564,024 B2 * | 7/2009 | Hofmeester et al. | 250/251 |
| 7,825,389 B2 * | 11/2010 | Hautala et al. | 250/492.3 |

(Continued)

OTHER PUBLICATIONS

International Search Report and Written Opinion of PCT/US10/040583.

*Primary Examiner* — David A Vanore
(74) *Attorney, Agent, or Firm* — Burns & Levinson LLP; Jerry Cohen; David W Gomes

(57) ABSTRACT

A gas-cluster-jet generator with improved vacuum management techniques and apparatus is disclosed. The gas-cluster-jet generator comprises a substantially conically shaped vacuum chamber for housing the nozzle and jet exit portions of the gas-cluster-jet generator. A skimmer may be located at the narrow end of the conical chamber and a close-coupled vacuum pump is located at the wide end of the conical chamber. Support members for the nozzle are high conductivity "spider" supports that provide support rigidity while minimizing gas flow obstruction for high pumping speed. The conically shaped vacuum chamber redirects un-clustered gas in a direction opposite the direction of the gas-cluster-jet for efficient evacuation of the un-clustered gas. The nozzle and a skimmer may have fixed precision relative alignment, or may optionally have a nozzle aiming adjustment feature for aligning the gas-cluster-jet with the skimmer and downstream beamline components. Also disclosed are various configurations of gas-cluster ion-beam processing tools employing the improved gas-cluster-jet generator.

18 Claims, 13 Drawing Sheets

U.S. PATENT DOCUMENTS

| | | | |
|---|---|---|---|
| 2001/0054686 A1* | 12/2001 | Torti et al. | 250/288 |
| 2003/0047676 A1* | 3/2003 | Grier et al. | 250/251 |
| 2008/0149826 A1* | 6/2008 | Renau et al. | 250/288 |
| 2009/0039254 A1 | 2/2009 | Choi et al. | |
| 2009/0084977 A1* | 4/2009 | Mack et al. | 250/423 R |
| 2010/0072393 A1* | 3/2010 | Regan | 250/424 |
| 2011/0155897 A1* | 6/2011 | Harrison | 250/251 |

* cited by examiner

GAS-CLUSTER-JET GENERATOR AND GAS-CLUSTER ION-BEAM APPARATUS UTILIZING AN IMPROVED GAS-CLUSTER-JET GENERATOR

CROSS REFERENCE TO RELATED APPLICATIONS

This application claims priority from U.S. Provisional Patent Application Ser. No. 61/221,720, filed Jun. 30, 2009 and incorporated herein by reference in its entirety for all purposes.

FIELD OF THE INVENTION

This invention relates generally to cluster jet formation and the use of an improved cluster-jet generator in a gas-cluster ion-beam apparatus for workpiece processing.

BACKGROUND OF THE INVENTION

Gas-cluster-jet nozzles are employed as a means of generating a neutral beam of gas-clusters for use in, for example, molecular beam epitaxy and gas-cluster ion-beam formation.

Gas-cluster-jets are typically formed by ejecting a high-pressure (typically about 2 atmospheres or more) condensable source gas into a vacuum through a nozzle. Various nozzle forms have been employed, including conical, sonic, and Laval forms. In each case, as the high-pressure gas expands into the vacuum through the nozzle, adiabatic expansion occurs and the source gas at least partially condenses into a beam of gas-clusters. The clusters may range in size of from as few as 2 to as many as tens of thousands of molecules (atoms in the case of monatomic gases) loosely bound together into clusters. In general the gas-cluster-jet contains a wide distribution of gas-cluster-sizes. Additionally, a large quantity of un-clustered gas atoms/molecules may also flow into the vacuum through the nozzle.

Many practical applications of gas-cluster-jets are best implemented in a low-pressure vacuum (as are the cluster generation, ionization, and acceleration processes), so it is important to be able to remove un-clustered gas from the vacuum system continuously and efficiently, so as to maintain the integrity of the vacuum in the system generating and employing the gas-cluster-jet. Conventionally, this has been done by the use of skimmers and collimators to separate the gas-cluster-jet from the un-clustered gas, by the use of differential vacuum pumping techniques, and by brute force application of large vacuum pumps with high pumping speed (typically, all three techniques employed in combination).

A field of application for gas-cluster-jets that has emerged as a practical industrial process in recent years has been in the formation of a gas-cluster ion-beam (GCIB). When a gas-cluster-jet is ionized using a conventional ionization process such as electron impact ionization, a fraction of the gas-clusters become ionized and can be accelerated and otherwise manipulated by electric and magnetic fields and may thus be employed in various useful industrial and scientific applications.

Gas-cluster ion-beams have been used to process surfaces for purposes of cleaning, etching, smoothing, film growth, doping, infusion, and the like. Gas-cluster ions are ionized, loosely bound, aggregates of materials that are normally gaseous under conditions of standard temperature and pressure, typically consisting of from a few hundred atoms or molecules to as many as a few ten thousands of atoms or molecules. Gas-cluster ions can be accelerated by electric fields to considerable energies of tens of thousands of eV or even more. However, because of the large number of atoms or molecules in each gas-cluster ion, and because of the loose binding of the clusters, their effect upon striking a surface is very shallow—the cluster is disrupted at impact and each atom or molecule carries only a few eV of energy. At the surface, instantaneous temperatures and pressures can be very high at gas-cluster ion impact sites, and a variety of surface chemistry, etching, shallow infusion, and cleaning effects can occur. Gas-cluster ion-beams have been used to clean and smooth medical implants and to adhere drugs to the surfaces of medical devices including stents (See U.S. Pat. No. 7,105,199 granted Sep. 12, 2006 to Blinn et al. and U.S. Pat. No. 6,676,989, granted Jan. 13, 2004 to Kirkpatrick et al.)

Other applications of GCIB include numerous uses in the field of electronics, including film formation, surface etching, surface smoothing, surface modification, shallow doping, and production of strained semiconductor materials.

Numerous prior art patents have disclosed details of GCIB apparatus, including the means of forming the neutral gas-cluster-jet. As examples see U.S. Pat. No. 5,814,194, Deguchi et al.; see JP 25093312A2, Toshihisa et al.; see U.S. Pat. No. 6,486,478, Libby et al.; see US 2006/0118731A1, Saito et al.; and see US 2003/0109092A1, Choi et al. All have employed the concepts: nozzle, skimmer, differential vacuum pumping, and large vacuum pumps.

Therefore it is an object of this invention to provide methods and systems for improved generation of a gas-cluster-jet by employing improved vacuum chamber geometry.

Another object of this invention to provide a GCIB processing system employing and benefiting from methods and systems for improved generation of a gas-cluster-jet with improved vacuum chamber geometry.

SUMMARY OF THE INVENTION

The objects set forth above as well as further and other objects and advantages of the present invention are achieved by the invention described hereinbelow.

The present invention provides a gas-cluster-jet generator with improved vacuum management techniques and apparatus. The gas-cluster-jet generator comprises a substantially conical shaped vacuum chamber for housing the nozzle and skimmer portions of the gas-cluster-jet generator. The skimmer may be located at the narrow end of the conical chamber and a close-coupled vacuum pump is located at the wide end of the conical chamber so that skimmed gases are evacuated in a direction opposite to the flow direction of the gas-cluster jet. Support members for the nozzle are high vacuum conductivity "spider" supports that provide support rigidity while minimizing gas flow obstruction for high pumping speed. The nozzle and skimmer may have precision, fixed relative alignment, or may optionally have an adjustable nozzle aiming capability for aligning the gas-cluster-jet with the skimmer.

The system may optionally employ a collimator for improved separation of gas-cluster-jet from un-clustered gas atoms/molecules. When employed as a gas-cluster-jet generator for a GCIB processing apparatus, the system may additionally employ an ionizer, an accelerator, an optional beam filter to remove monomer and low-mass ions from the GCIB, and a target holder and/or manipulator.

One embodiment of the present invention provides an apparatus for generating a gas-cluster beam, comprising a gas expansion nozzle mounted in a chamber to cause gas clusters from the expansion nozzle to form a beam passing through the chamber in a predetermined direction and through an aperture at an end of the chamber, wherein the chamber is formed by one or more surfaces surrounding the beam and aperture and located to deflect gas clusters and molecules from the nozzle that are not traveling within and aligned with the beam away from the beam and towards an opposing predetermined direction The one or more surfaces may include a conical first surface coaxially surrounding the beam and angled towards the opposing predetermined direction. The one or more surfaces include a flat second surface surrounding the aperture and facing the opposing predetermined direction.

The one or more surfaces may include one or more third surfaces facing away from the beam and located immediately surrounding the beam to deflect gas molecules and clusters traveling at more than a predetermined distance from the beam away from the beam. The apparatus may further comprise a vacuum apparatus located behind the expansion nozzle for evacuating deflected gas molecules and clusters that are not part of the beam from the chamber in the opposing predetermined direction.

The gas expansion nozzle may be mounted at opposing input and outlet ends using a limited number of elongated members extending from sides of the chamber to allow easy flow of gas molecules and clusters that are not part of the beam in the opposing predetermined direction. The gas expansion nozzle may be adjustably mounted at the outlet end of the nozzle to enable adjustment of the predetermined direction. The gas expansion nozzle may be tiltably mounted at the input end of the nozzle to support adjustment of the predetermined direction at the outlet end of the nozzle.

The one or more surfaces may have substantially the shape of a cone or a pyramid or a elliptic paraboloid or an ellipsoid. The one or more surfaces may surround substantially all of the beam located within the chamber.

The apparatus may further comprise a second chamber surrounding the gas cluster beam beyond the aperture and the first said chamber and having a second aperture located for allowing further flow of the gas cluster beam. The apparatus may still further comprise one or more fourth surfaces facing away from the beam and located immediately surrounding the beam at the second aperture for deflecting gas molecules and clusters traveling at more than a predetermined distance from the beam away from the beam. The gas expansion nozzle may be mounted at input and outlet ends, and the outlet end may be adjustably mounted to enable adjustment of the predetermined direction. The second chamber may be formed by at least one plane surface oriented at an angle of from 30° to about 60° with respect to the gas cluster being and adapted to direct gas molecules and clusters that are not part of the beam away from the beam.

In another embodiment, the present invention provides a gas-cluster ion-beam processing apparatus comprising the gas-cluster beam generator apparatus for generating a gas-cluster beam as described above, an ionizer for ionizing at least a portion of the gas-cluster beam to form a gas-cluster ion-beam having a path, and a workpiece holder for supporting a workpiece in the path of the gas-cluster ion-beam. The gas-cluster ion-beam processing apparatus may further comprise a differential pumping chamber having a plane surface oriented at an angle of from about 30 degrees to about 60 degrees with respect to a gas-cluster beam trajectory and adapted to direct at least a portion of un-clustered gas into a vacuum pump.

Yet another embodiment of the present invention provides a method for generating a gas-cluster beam, comprising the steps of directing a gas expansion nozzle into a chamber to cause gas clusters from the expansion nozzle to form a beam passing through the chamber in a predetermined direction and through an aperture at an end of the chamber, deflecting gas clusters and molecules from the nozzle that are not traveling within and aligned with the beam away from the beam and towards an opposing predetermined direction using walls of the chamber that surround the beam and aperture, and creating a vacuum behind the expansion nozzle for evacuating deflected gas molecules and clusters that are not part of the beam from the chamber.

The step of directing may include adjustably mounting the outlet end of the nozzle and adjusting the predetermined direction.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1:
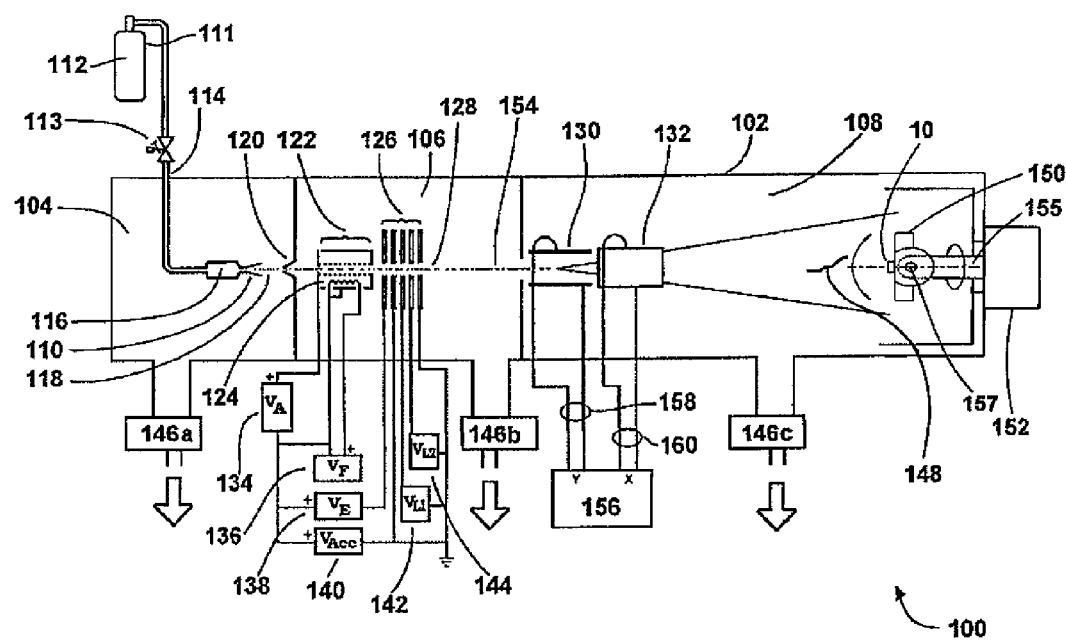
FIG. 1 is a schematic view of a prior art GCIB apparatus of conventional design.

Reference is made to FIG. 1 of the drawings, which shows a typical GCIB processor 100 of a type known in prior art for surface processing. Although not limited to the specific components described herein, the processor 100 is made up of a vacuum vessel 102 which is divided into three communicating chambers: a source chamber 104, an ionization/acceleration chamber 106, and a processing chamber 108 which includes therein a workpiece holder 150 capable of positioning a workpiece 10 for processing by a gas cluster ion beam.

During use, the three chambers are evacuated to suitable operating pressures by vacuum pumping systems 146a, 146b, and 146c, respectively. A condensable source gas 112 (for example argon, $O_2$, $CO_2$, or $N_2$ or other condensable gas) stored in a cylinder 111 is admitted under pressure through gas metering valve 113 and gas feed tube 114 into stagnation chamber 116 and is ejected into the substantially lower pressure vacuum through a suitably shaped nozzle 110, resulting in a supersonic gas jet 118. Cooling, which results from the adiabatic expansion in the jet, causes a portion of the gas jet 118 to condense into gas clusters, most consisting of from a few hundred to several thousand (or even tens of thousands) weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to inert gases (such as argon), nitrogen, carbon dioxide, and oxygen.

After the supersonic gas jet 118 containing gas clusters has been formed, the gas clusters are ionized in an ionizer 122. The ionizer 122 may be an electron impact ionizer that produces thermoelectrons from one or more incandescent filaments 124 and accelerates and directs the electrons causing them to collide with the gas clusters in the gas jet 118, where the jet passes through the ionizer 122. Other conventional types of electron sources may alternatively be employed as sources of electrons for impact ionization. The electron impact on the gas clusters ejects electrons from the clusters, causing a portion the clusters to become positively ionized. A set of suitably biased high voltage electrodes 126 extracts the cluster ions from the ionizer 122, forming a beam, then accelerates the cluster ions with an acceleration potential (typically from 1 kV to as much as several tens of kV) and focuses them to form a GCIB 128 having an initial trajectory 154. Filament power supply 136 provides voltage $V_F$ to heat the ionizer filament 124. Anode power supply 134 provides voltage $V_A$ to accelerate thermoelectrons emitted from filament 124 to cause them to bombard the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{Acc}$ to bias a high voltage electrode with respect to the ionizer 122 so as to result in a total GCIB acceleration potential equal to $V_{Acc}$ volts (V). One or more lens power supplies (142 and 144, for example) may be provided to bias high voltage electrodes with potentials ($V_{L1}$ and $V_{L2}$, for example) to focus the GCIB 128.

A workpiece 10 to be processed by the GCIB processor 100 is held on a workpiece holder 150, disposed in the path of the GCIB 128. In order to accomplish uniform processing of the workpiece 10, the workpiece holder 150 may be designed to appropriately manipulate workpiece 10, as may be required for uniform processing.

Any workpiece surfaces that are non-planar, for example, spherical or cup-like, rounded, irregular, or other un-flat configuration, may be oriented within a range of angles with respect to the beam incidence to obtain optimal GCIB processing of the workpiece surfaces. This employs a workpiece holder 150 with the ability to be fully articulated for orienting all non-planar surfaces to be processed in suitable alignment with the GCIB to provide processing optimization and uniformity. More specifically, when the workpiece 10 being processed is non-planar, the workpiece holder 150 may be rotated and articulated by an articulation/rotation mechanism 152 located at the end of the GCIB processor 100. The articulation/rotation mechanism 152 preferably permits 360 degrees of device rotation about longitudinal axis 155 (which may be coaxial with the initial trajectory 154 of the GCIB 128) and sufficient articulation about an axis 157 perpendicular to axis 155 to maintain the workpiece surface to within a desired range of beam incidence.

Under certain conditions, depending upon the size of the workpiece 10, a scanning system may be desirable to produce uniform irradiation of a large workpiece. Although often not necessary for GCIB processing, two pairs of orthogonally oriented electrostatic scan plates 130 and 132 may be utilized to produce a raster or other scanning pattern over an extended processing area. When such beam scanning is performed, a scan generator 156 provides X-axis and Y-axis scanning signal voltages to the pairs of scan plates 130 and 132 through lead pairs 158 and 160 respectively. The scanning signal voltages are commonly triangular waves of different frequencies that cause the GCIB 128 to be converted into a scanned GCIB 148, which scans the entire surface of the workpiece 10.

When beam scanning over an extended region is not desired, processing is generally confined to a region that is defined by the diameter of the beam. The diameter of the beam at the surface of the workpiece can be set by selecting the voltages ($V_{L1}$ and/or $V_{L2}$) of one or more lens power supplies (142 and 144 shown for example) to provide the desired beam diameter at the workpiece. Although not specifically shown, such prior art GCIB processing systems typically employ sensors and circuits for measuring and controlling the GCIB parameters (as for example acceleration potential, beam current, beam focus, gas flow, beam dose applied to the workpiece, workpiece manipulation, etc.) important to processing and also employ additional controls and automation for automatic processing and management of processing recipe selection and control.

Although FIG. 1 shows a workpiece holder and manipulator suitable for holding and manipulating certain types of planar and simply shaped non-planar workpieces, it will be understood by those familiar with the prior art that other types of simpler and more complex holders and manipulators are known. For example, U.S. Pat. No. 6,676,989, Kirkpatrick et al. teaches a holder and manipulator optimized for processing tubular or cylindrical workpieces such as vascular stents. Manipulators for exposing multiple surfaces of biological materials to GCIB irradiation will be known to those skilled in the art and/or may readily be constructed using no more than ordinary skill. Simple workpiece holders without manipulation may be employed when manipulation is not required.

In the following description, for simplification of the drawings, item numbers from earlier figures may appear in subsequent figures without discussion. Likewise, items discussed in relation to earlier figures may appear in subsequent figures without item numbers or additional description. In such cases items with like numbers are like items and have the previously described features and functions and illustration of items without item numbers shown in the present figure refer to like items having the same functions as the like items illustrated in earlier numbered figures.

Figure 2:
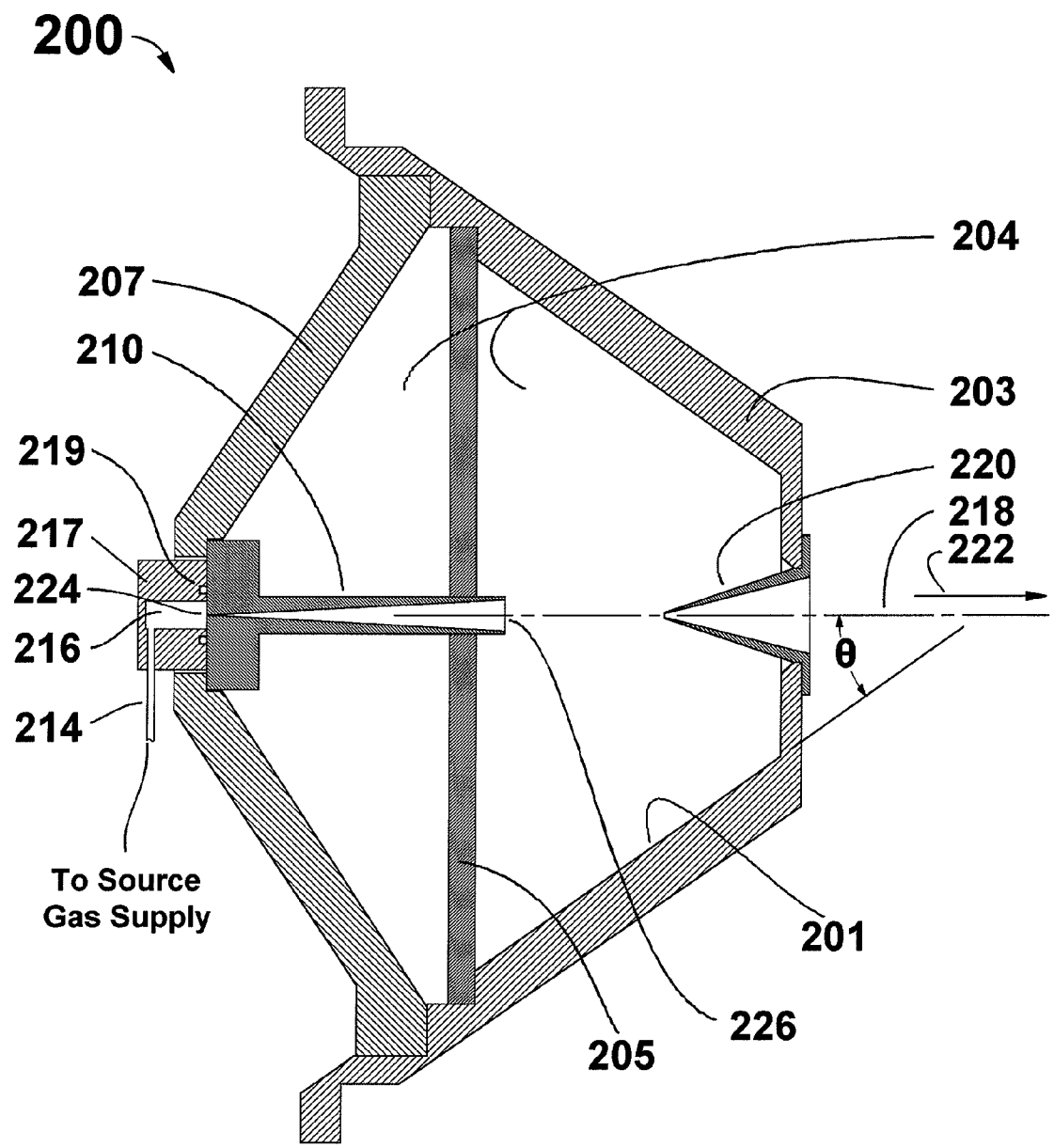
FIG. 2 is a cross-sectional view of a portion of an improved gas-cluster-jet generator according to a first embodiment of the invention.

FIG. 2 is a cross-sectional view 200 of a portion of an improved gas-cluster-jet generator according to a first embodiment of the invention. A conical gas-cluster-jet generator chamber enclosure 203 encloses a gas-cluster-jet generator chamber 204. The conical gas-cluster-jet generator chamber enclosure 203 is substantially conical and has an inner surface 201 that is conically coaxial with gas-cluster-jet trajectory 218. Gas-cluster-jet trajectory 218 has a flow direction 222. The inner surface 201 forms a circular cone with conical half-angle θ, with respect to gas-cluster-jet trajectory 218. The conical half-angle θ may be in the range of from about 30 degrees to about 50 degrees dependent on other geometrical considerations of the application, but it is preferably about 35 degrees. First nozzle support spider 205 and second nozzle support spider 207 support the nozzle 210. A high-pressure source gas is delivered to the nozzle 210 through a flexible gas feed tube 214 and gas flange 217, attached to the nozzle 210 and sealed with O-ring 219. The nozzle 210 has an upstream end 224 and a downstream end 226. An opening in the gas flange 217 forms a stagnation chamber 216. The conical gas-cluster-jet generator chamber enclosure 203 supports a gas skimmer 220 at its narrow end. Nozzle 210 and gas skimmer 220 are supported with respect to one another in precision alignment such that the gas-cluster-jet trajectory for the gas-cluster-jet formed by the nozzle 210 passes through the gas skimmer 220. The conical gas-cluster-jet generator chamber 203, the first nozzle support spider 205, the second nozzle support spider 207, the nozzle 210, and the gas skimmer 220 are all precision machined with close tolerance mating surfaces so that the nozzle 210 and gas skimmer 220 are positioned with precision alignment with respect to one another, such that the gas-cluster-jet trajectory 218 of the gas-cluster-jet formed by the nozzle 210 passes through the gas skimmer 220.

The nozzle 210 may preferably be a conical metal nozzle having an inlet throat of about 50 micrometers diameter and an outlet opening of about 6.4 millimeters diameter, and an overall length of about 60 millimeters. Alternatively nozzles of other forms, materials, and dimensions can be employed as will be known to those skilled in the art.

Figure 3:
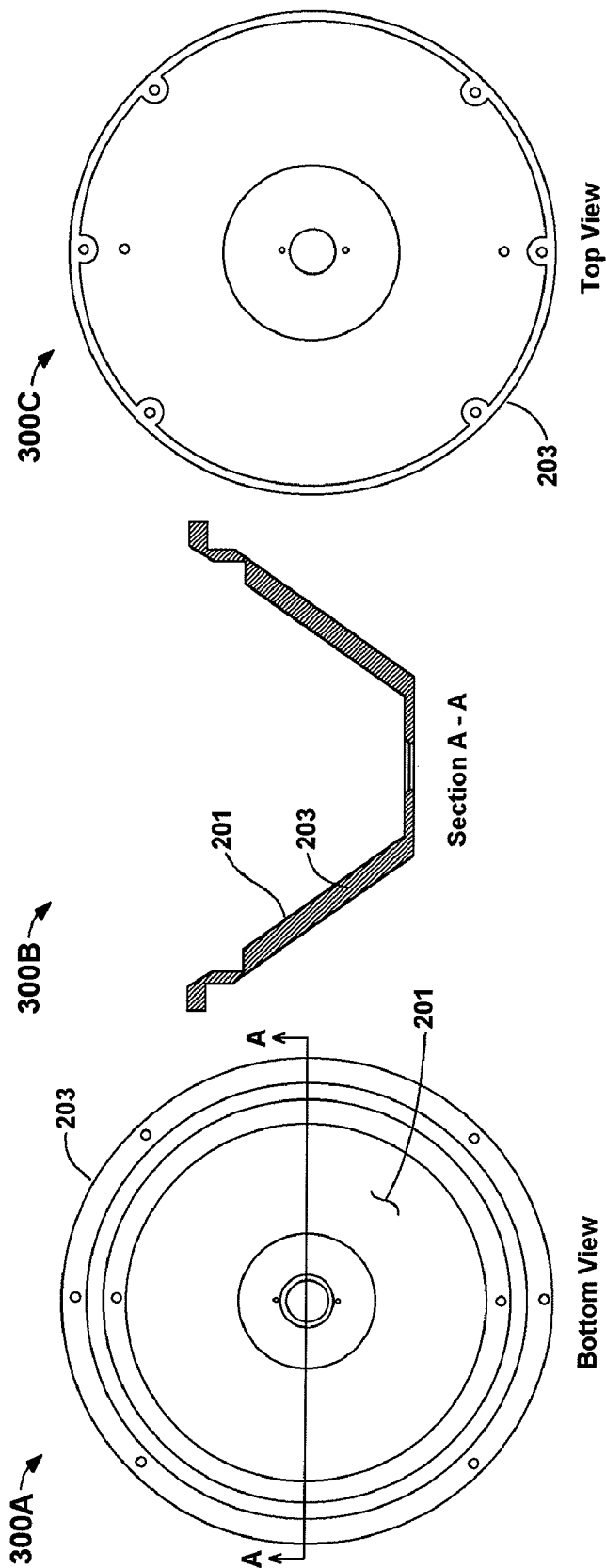
FIGS. 3A, 3B, and 3C are detail views of a conical vacuum chamber enclosure employed in the improved gas-cluster-jet generator of the first embodiment of the invention.

FIGS. 3A, 3B, and 3C are detail views of the conical gas-cluster-jet generator chamber enclosure 203. FIG. 3A is a bottom view 300A. FIG. 3B is a cross-sectional view 300B. FIG. 3C is a top view 300C. The FIGS. 3A-3B show that the shape of the inner surface 201 of the conical gas-cluster-jet generator chamber enclosure 203 is substantially a solid, truncated right circular cone coaxial with the gas-cluster-jet trajectory 218 (of FIG. 2).

Figure 4:
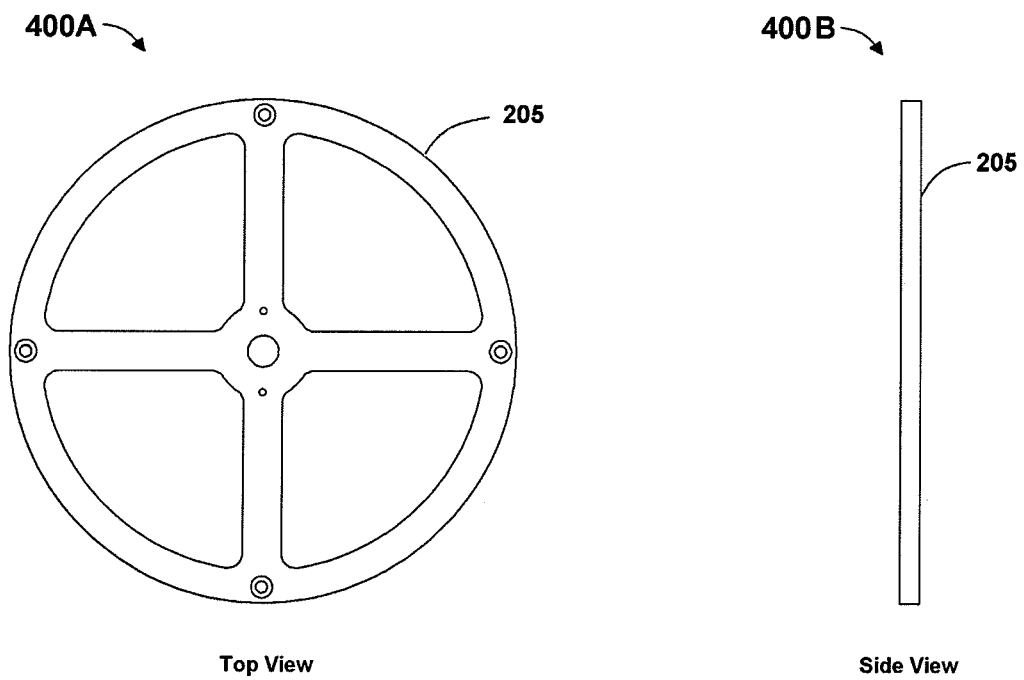
FIGS. 4A and 4B are detail views of the first nozzle support spider employed in the improved gas-cluster-jet generator of the first embodiment of the invention.

FIGS. 4A and 4B are detail views of the first nozzle support spider 205. FIG. 4A is a top view 400A, and FIG. 4B is a side view 400B. The FIGS. 4A and 4B show that first nozzle support spider 205 has an open structure with spider support of a central portion such the central portion is rigidly supported, but yet provides an open, high transparency, high conductance pathway for evacuation of skimmed un-clustered gas from the gas-cluster-jet generator chamber 204 (of FIG. 2).

Figure 5:
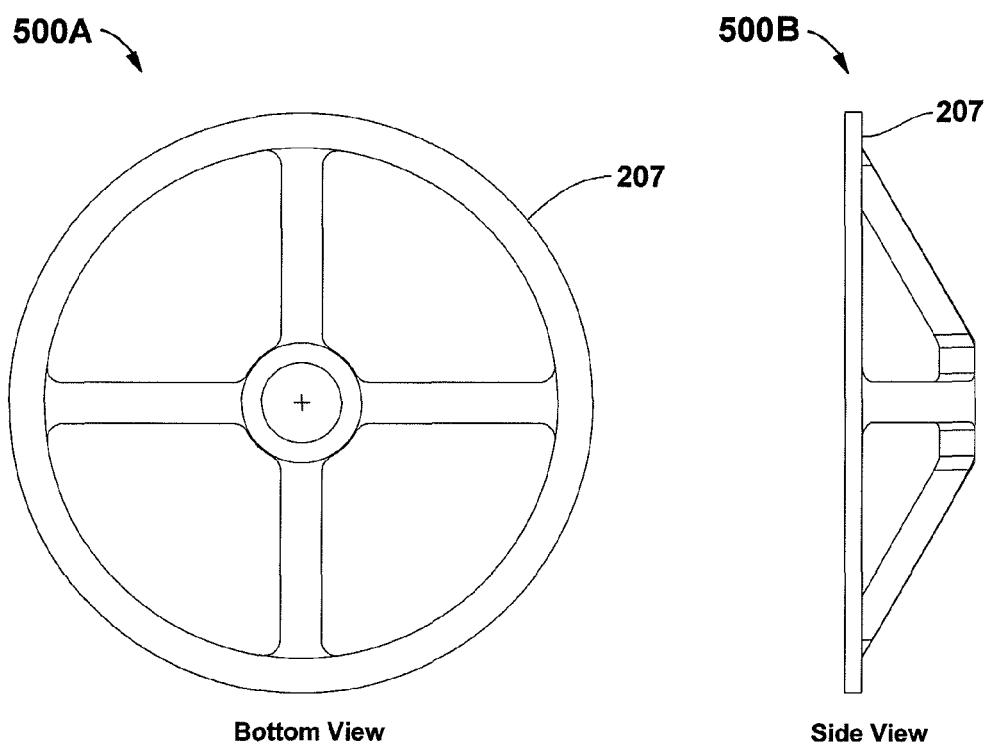
FIGS. 5A and 5B are detail views of the second nozzle support spider employed in the improved gas-cluster-jet generator of the first embodiment of the invention.

FIGS. 5A and 5B are detail views of the second nozzle support spider 207. FIG. 5A is a bottom view 500A, and FIG. 5B is a side view 500B. The FIGS. 5A and 5B show that second nozzle support spider 207 has an open structure with spider support of a central portion such the central portion is rigidly supported, but yet provides an open, high transparency, high conductance pathway for evacuation of skimmed un-clustered gas from the gas-cluster-jet generator chamber 204 (of FIG. 2).

Figure 6:
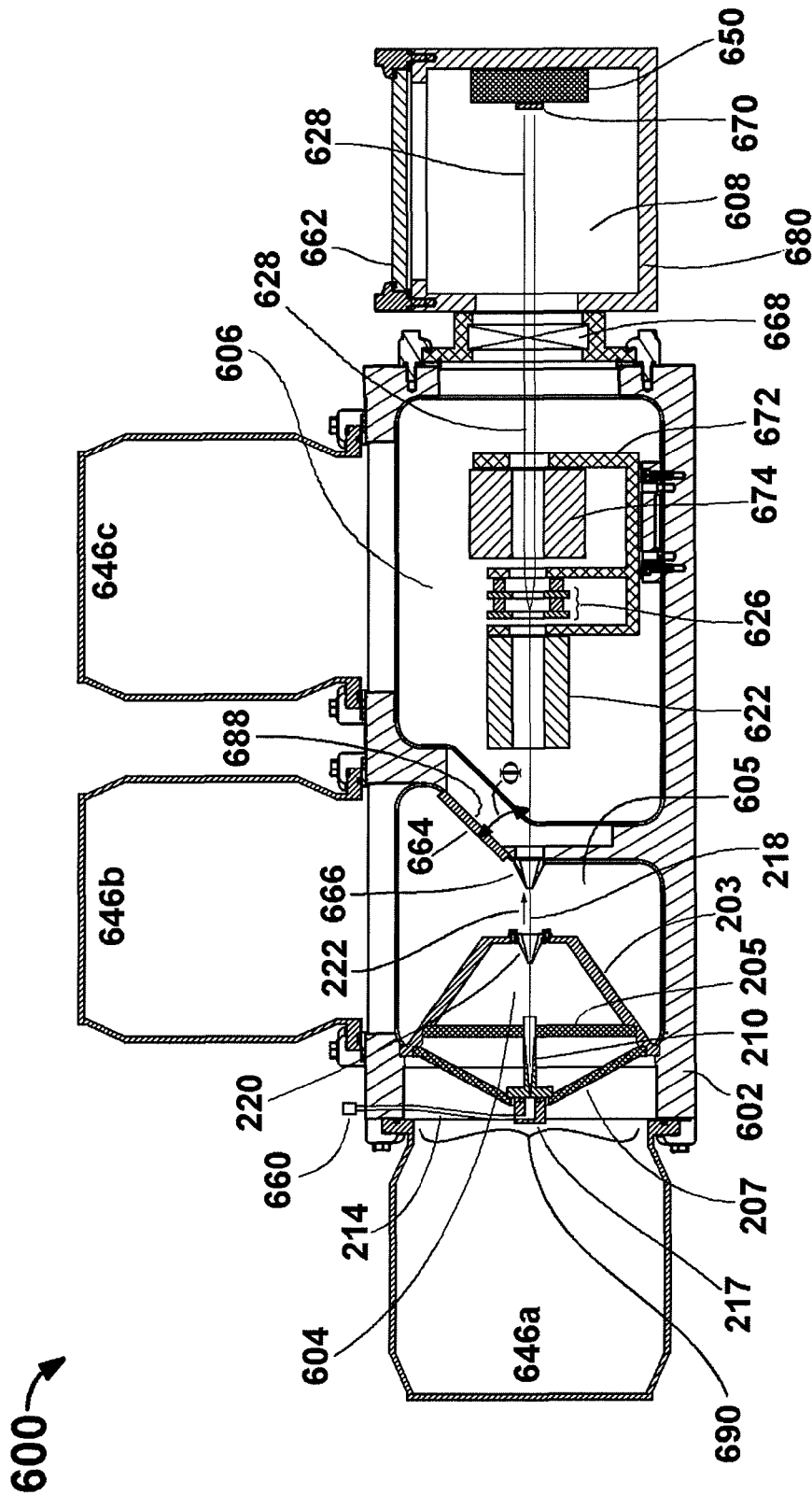
FIG. 6 is a schematic view of a GCIB processing system including the improved gas-cluster-jet generator of the first embodiment of the invention.

FIG. 6 is a schematic view of a GCIB processing system 600 including the improved gas-cluster-jet generator of the first embodiment of the invention. Although the improved gas-cluster-jet generator is implemented as a gas-cluster-jet generator for a GCIB processing apparatus, it is understood and intended by the inventors that the same concept is not limited thereby and is employable in other gas-cluster-jet applications such as for example molecular beam epitaxial growth apparatus, or other applications employing gas-cluster-jet generation. Such applications are intended to be included within the scope of the invention.

The GCIB processing system 600 includes the portion of an improved gas-cluster-jet generator 200 shown in FIG. 2. Referring again to FIG. 6, a GCIB system enclosure 602 encloses the GCIB processing system 600, and includes an intermediate chamber 605 and may include a collimator 666. It also includes a beamline chamber 606. A processing chamber 608 is enclosed by a processing chamber enclosure 680 for receiving a GCIB 628 for processing a workpiece 670. An isolation valve 668 controllably isolates or connects the processing chamber 608 with the beamline chamber 606. When isolated, the processing chamber may be vented to atmosphere for maintenance or for inserting and/or removing workpieces for processing. When vented, a processing chamber access/viewing port 662 facilitates access to the processing chamber. When evacuated, the processing chamber access/viewing port 662 serves as a window for observation. A vacuum system (not shown) is present to evacuate the processing chamber 608 to rough vacuum before opening the isolation valve 668 between the processing chamber 608 and the beamline chamber 606. A workpiece holder 650 is provided in the processing chamber 608 for holding the workpiece 670 in the path of the GCIB 628 for workpiece processing. Although a simple workpiece holder 650 is illustrated, it is understood that more complex manipulating or scanning workpiece holders as will readily be known to or devised by those skilled in the art may be employed and it is intended that such be included within the scope of the invention.

The intermediate chamber 605 and the beamline chamber 606 have an opening 688 between them. Opening 688 is normally closed by blank-off plate 664, so that the only communication between the intermediate chamber 605 and the beamline chamber 606 is the aperture of the collimator 666. An intermediate chamber vacuum pump 646b evacuates the intermediate chamber 605. A beamline chamber vacuum pump 646c evacuates the beamline chamber 606. Optionally, the blank-off plate 664 can be removed so that the intermediate chamber 605 and the beamline chamber 606 communicate through opening 688 and the system can be operated with one of the vacuum pumps 646b and 646c removed and blanked off or disabled.

Any un-clustered gas from the gas-cluster-jet generator chamber 204 (of FIG. 2) that is not skimmed by the skimmer 220, may be separated from the gas-cluster-jet by the collimator 666 and evacuated by the vacuum pump 646b. The interior wall portion of the intermediate chamber 605 formed by blank-off plate 664 is oriented at an angle φ with respect to the gas-cluster-jet trajectory 218 so as to position the interior (to intermediate chamber 605) surface of blank-off plate 664 in such a way as to direct at least a portion of un-clustered gas separated from the gas-cluster jet by the collimator 666 into the vacuum pump 646b and to facilitate coupling of a large mouth, high pumping speed vacuum pump 646b to the relatively smaller intermediate chamber 605 if so desired to improve the vacuum in intermediate chamber 605. In such configuration, and with blank-off plate 664 closing the opening 688, the intermediate chamber 605 can serve as a highly effective differential pumping chamber to improve the downstream vacuum in beamline chamber 606. The angle I is preferably in the range of from about 30 degrees to about 60 degrees and directs un-clustered gas to the vacuum pump 464b more effectively than if the angle (I) were 90 degrees.

Beamline chamber 606 encloses an ionizer 622 for ionizing a gas-cluster-jet following gas-cluster-jet trajectory 218. The ionizer 622 converts the gas-cluster-jet to a GCIB 628. A set of high voltage electrodes 626 (two electrodes shown for example, not for limitation) serves to extract the GCIB 628 from the ionizer 622, to accelerate the GCIB 628 to a desired energy, and optionally to focus the GCIB 628, according to conventional GCIB technology. An optional beam filter 674 selectively removes monomer ions and optionally small cluster ions from the GCIB 628 when very small clusters or monomers are undesirable. The beam filter 674 may be a magnetic beam filter that deflects low mass cluster ions out of the main GCIB 628. A beamline component support bracket 672 supports the ionizer 622, the high voltage electrodes 626, and the optional beam filter 674 in proper location relative to the gas-cluster-jet trajectory 218 and the GCIB 628.

Generation of the gas-cluster-jet is done in the source chamber 604. An external conventional source gas supply (not shown but typical to that of FIG. 1) provides a high pressure gas to the gas-cluster-jet generator through flexible gas feed tube 214 by connection at gas coupling 660. The external source gas supply supplies gas and provides flow control to control the gas flow rate of gas through the nozzle 210. The GCIB system enclosure 602 serves to closely couple the mouth 690 of the source chamber vacuum pump 646a to the large diameter end of the conical gas-cluster-jet generator chamber enclosure 203. Thus the source chamber 604 includes the volume between the conical gas-cluster-jet generator chamber enclosure 203 and the mouth 690 of the source chamber vacuum pump 646a. The source chamber 604 volume includes and is somewhat greater than the volume of the gas-cluster-jet generator chamber 204 (of FIG. 2). Referring again to FIG. 6, the conical shape of the inner surface of the conical gas-cluster-jet generator chamber enclosure 203 serves to efficiently direct un-clustered gas atoms/molecules skimmed from the gas-cluster-jet by the gas skimmer 220 in a direction opposite to the flow direction 222 of the gas-cluster-jet trajectory 218 and into the mouth 690 of the source chamber vacuum pump 646a for evacuation thereby. The open, transparent, high conductivity constructions of the first nozzle support spider 205 and the second nozzle support spider 207 and the close coupling of the mouth 690 of the source chamber vacuum pump 646a also facilitate the efficient transport of gas to the source chamber vacuum pump 646a. The source chamber vacuum pump 646a may be a turbo-molecular vacuum pump with a mouth diameter approximately the same as the diameter of the large end of the conical gas-cluster-jet generator chamber enclosure. The improved source chamber 604 including the improved gas-cluster-jet generator results in better vacuum attainment, lower vacuum pump performance requirements and/or a combination of both. Thus it can offer improved performance and/or reduced cost.

Although the invention has been described above in terms of a gas-cluster-jet generator comprising a substantially conically shaped inner surface of the conical gas-cluster-jet generator chamber enclosure 203 that serves to efficiently direct un-clustered gas atoms/molecules skimmed from the gas-cluster-jet by the gas skimmer 220 in a direction opposite to the flow direction 222 of the gas-cluster-jet trajectory 218 and into the mouth 690 of the source chamber vacuum pump 646a for evacuation thereby, it is recognized by the inventors that other shapes including, without limitation, substantially pyramidal and substantially elliptic paraboloid and substantially ellipsoid shapes (or truncated portions of those shapes) for the inner surface of the gas-cluster-jet generator chamber enclosure 203 will also serve to efficiently direct un-clustered gas atoms/molecules skimmed from the gas-cluster-jet by the gas skimmer 220 in a direction opposite to the flow direction 222 of the gas-cluster-jet trajectory 218 and into the mouth 690 of the source chamber vacuum pump 646a for evacuation thereby. When a truncated pyramidal gas-cluster-jet generator chamber is used as an alternative to the conical gas-cluster-jet generator chamber enclosure 203, the cross section appears identical to the conical gas-cluster-jet generator chamber enclosure 203. It is intended that such alternate embodiments are included within the scope of the invention.

Figure 7:
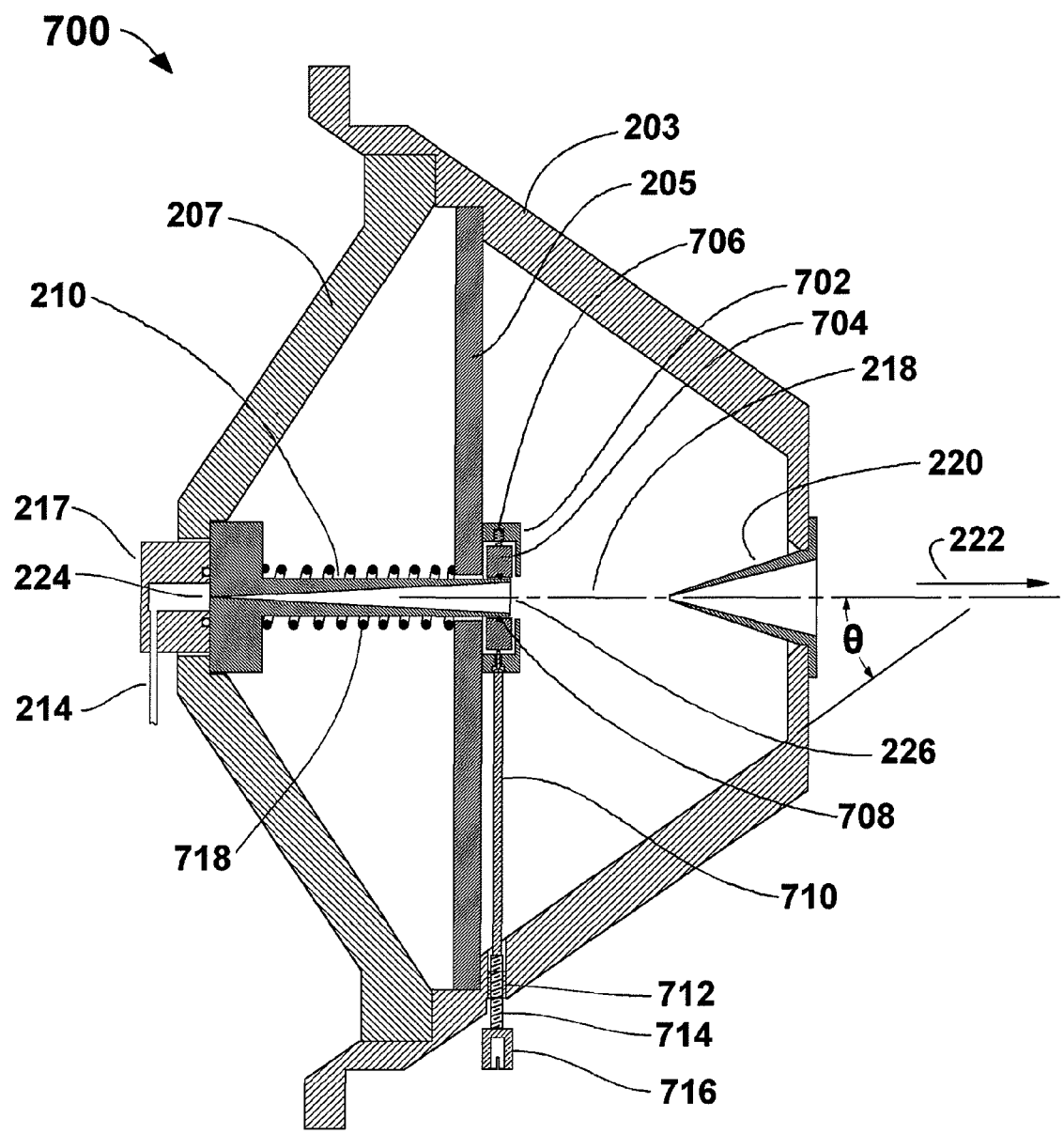
FIG. 7 is a cross-sectional view of a portion of an improved gas-cluster-jet generator according to a second embodiment of the invention that incorporates a nozzle adjustment.

FIG. 7 is a cross-sectional view 700 of a portion of an improved gas-cluster-jet generator according to a second embodiment of the invention that incorporates a nozzle alignment adjustment. A conical gas-cluster-jet generator chamber enclosure 203 encloses a gas-cluster-jet generator chamber 204. The conical gas-cluster-jet generator chamber enclosure 203 is substantially conical and has an inner surface 201 that is conically coaxial with gas-cluster-jet trajectory 218. The inner surface 201 forms a circular cone with conical half-angle $\theta$, with respect to gas-cluster-jet trajectory 218. The conical half-angle $\theta$ may be in the range of from about 30 degrees to about 50 degrees dependent on other geometrical considerations of the application, but it is preferably about 35 degrees. First nozzle support spider 205 and second nozzle support spider 207 support the nozzle 210. First nozzle support spider 205 movably supports the nozzle 210 near its outlet or downstream end 226 and second nozzle support spider 207 movably supports nozzle 210 near its input or upstream end 224. A high-pressure source gas is delivered to the nozzle 210 through a flexible gas feed tube 214 and gas flange 217, attached to the nozzle 210 and sealed with O-ring 219. An opening in the gas flange 217 forms a stagnation chamber 216. The conical gas-cluster-jet generator chamber enclosure 203 supports a gas skimmer 220 at its narrow end. Nozzle 210 and gas skimmer 220 are aligned with respect to one another in an adjustable alignment such that the gas-cluster-jet trajectory for the gas-cluster-jet formed by the nozzle 210 passes through the gas skimmer 220. The downstream end 226 is the exit end of the nozzle 210 and passes through the first nozzle support spider 205 with a loose clearance fit that permits motion of the nozzle 210 with respect to the first nozzle support spider 205. The throat end (gas input end 224) of the nozzle 210 fits into a recess in the second nozzle support spider 207 with a small amount of clearance that permits a slight tilting motion of the upstream end 224 of nozzle 210 with respect to the second nozzle support spider 207. A compressed coil spring 718 biases the nozzle input end 224 against the second nozzle support spider 207. This arrangement allows a force acting laterally to the outlet end 226 to displace the outlet end 226 and to tilt the nozzle 210 slightly with respect to the resting position of the nozzle 210. Thus the gas cluster jet trajectory 218 from an initially misaligned nozzle 210 can be steered to optimize the gas-cluster flow that passes through the entrance aperture of the gas skimmer 220, without necessity of inherently precise fixed alignment (as in the earlier-discussed first embodiment). This is particularly useful in the embodiments of FIGS. 6, 9, 11 and 12, wherein a skimmer or collimator is located at greater distance from the nozzle.

A nozzle steering clamp 702 is attached to the first nozzle support spider 205 and encloses an O-ring carrier 704. An O-ring 708 is held in an internal diameter groove in the O-ring carrier 704 and tightly but flexibly engages the outer diameter of the exit end of the nozzle 210. A compressed first coil spring 706 biases the O-ring carrier 704 against an opposing first steering shaft 710. When first steering shaft 710 moves longitudinally, it moves the O-ring carrier 704 and the exit end of the nozzle 210 in the direction of the longitudinal motion of the first steering shaft 710, increasing or decreasing the compression in first coil spring 706. First steering shaft 710 has a threaded portion 714 that engages a first threaded opening 712 in the conical gas-cluster-jet generator chamber enclosure 203 and has a first control shaft coupler 716 for connecting to a rotary motion shaft for adjusting the longitudinal motion of first steering shaft 710.

The nozzle 210 may preferably be a conical metal nozzle having an inlet throat of about 50 micrometers diameter and an outlet opening of about 6.4 millimeters diameter, and an overall length of about 60 millimeters. Alternatively nozzles of other forms, materials, and dimensions can be employed as will be known to those skilled in the art.

Figure 8:
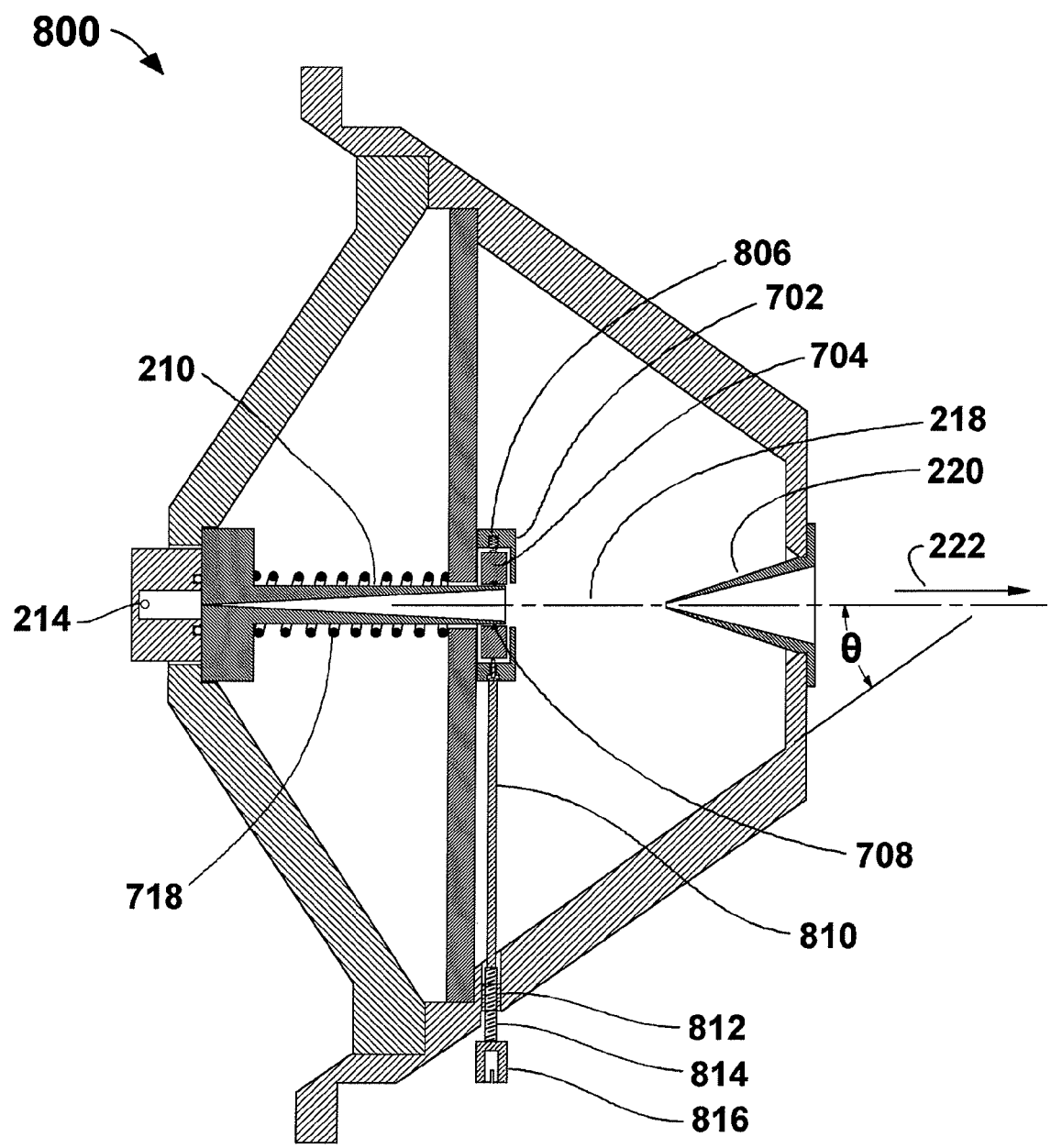
FIG. 8 is a cross-sectional view of a rotated portion of an improved gas-cluster-jet generator according to the second embodiment of the invention.

FIG. 8 is a rotated cross-sectional view 800 of the improved gas-cluster-jet generator also shown in FIG. 7. In FIG. 8, the gas-cluster-jet generator has been rotated 90 degrees about the gas-cluster-jet trajectory 218 with respect to the position illustrated in FIG. 7. Thus FIG. 8 permits viewing a second steering shaft 810 that steers the nozzle 210 in a direction orthogonal to that of the first steering shaft 710. A compressed second coil spring 806 biases the O-ring carrier 704 against an opposing second steering shaft 810. When second steering shaft 810 moves longitudinally, it moves the O-ring carrier 704 and the exit end of the nozzle 210 in the direction of the longitudinal motion of the second steering shaft 810, increasing or decreasing the compression in second coil spring 806. Second steering shaft 810 has a threaded portion 814 that engages a second threaded opening 812 in the conical gas-cluster-jet generator chamber enclosure 203 and has a second control shaft coupler 816 for connecting to a rotary motion shaft for adjusting the longitudinal motion of second steering shaft 810.

Figure 9:
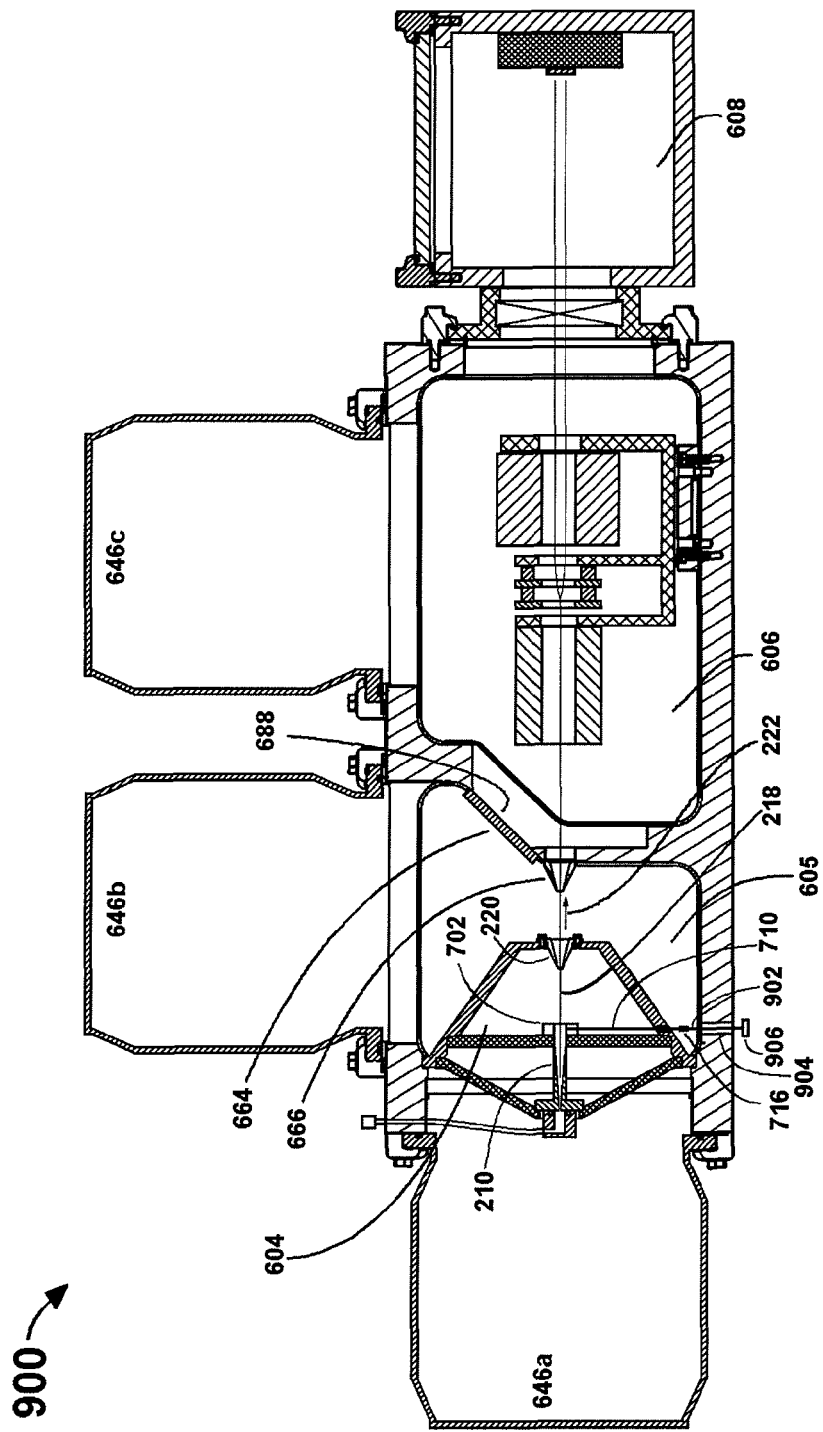
FIG. 9 is a schematic view of a GCIB processing system incorporating the improved gas-cluster-jet generator of the second embodiment of the invention.

FIG. 9 is a schematic view of one configuration of a GCIB processing system 900 including the improved gas-cluster-jet generator of the second embodiment of the invention. The GCIB processing system 900 includes the portion of an improved gas-cluster-jet generator shown in FIGS. 7 and 8. Referring again to FIG. 9, a first control shaft 902 connects with the first steering shaft 710 via first control shaft coupler 716. First control shaft 902 passes through a first rotary motion vacuum feedthrough 904 and has attached a first control shaft adjustment knob 906 for adjusting the longitudinal motion of first steering shaft 710 to control the alignment of nozzle 210 (and thus the gas-cluster-jet trajectory 218) with respect to gas skimmer 220 and other downstream beamline components. Like (not visible in this view) elements connected with second steering shaft 810 (not visible in this view) provide for adjusting the longitudinal motion of second steering shaft 810 and thus for controlling the alignment of nozzle 210 in an orthogonal direction.

Figure 10:
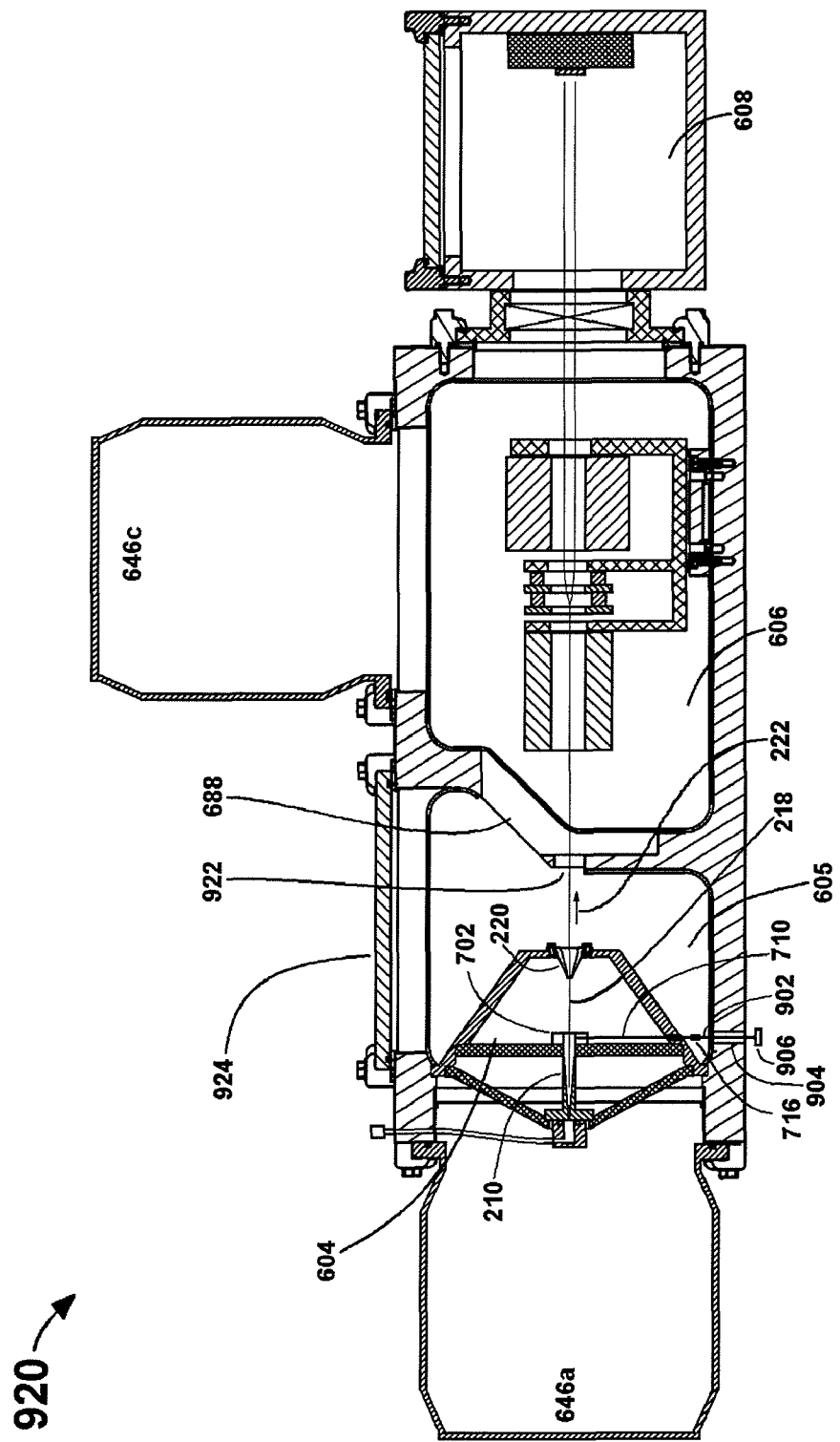
FIG. 10 is a schematic view of an alternative configuration of a GCIB processing system incorporating the improved gas-cluster-jet generator of the first or second embodiment of the invention.

FIG. 10 is a schematic view of a second configuration of a GCIB processing system 920 including the improved gas-cluster-jet generator of the second embodiment of the invention. In this configuration, the GCIB processing system 920 employs skimmer 220 but does not employ any collimator (previously shown as item 666 in FIGS. 6 and 9). Referring again to FIG. 10, this second configuration employs the features of the second embodiment of the invention for steering the gas-cluster-jet 218 through the skimmer 220. Though not shown, this second configuration of a GCIB processing system 920 may alternatively employ the gas-cluster-jet generator of the first embodiment of the invention (with fixed alignment of nozzle 210 and skimmer 220). Since no collimator is employed, a beam opening 922 between the intermediate chamber 605 and the beamline chamber 606 facilitates passage of the gas-cluster-jet along the gas-cluster-jet trajectory 218 into the beamline chamber 606. No blank-off plate (as previously shown as item 664 of FIG. 9) is employed in this configuration of FIG. 10. Referring again to FIG. 10, the opening 668 between intermediate chamber 605 and beamline chamber 605 provides fluid communication between intermediate chamber 605 and beamline chamber 606. No intermediate chamber vacuum pump (as previously shown as item 646b in FIG. 9) is employed in this configuration of FIG. 10. Referring again to FIG. 10, a blank-off plate 924 seals the intermediate chamber 605 from atmospheric pressure. Thus the intermediate chamber 605 is evacuated primarily by the beamline chamber vacuum pump 646c and may operate at a higher pressure than it does in the configuration shown in FIG. 9. In the configuration of FIG. 10, the cost of an intermediate chamber vacuum pump is eliminated, which is an economic advantage that may be traded off with any gas-cluster-jet intensity reduction resulting from a higher pressure in the intermediate chamber 605.

Figure 11:
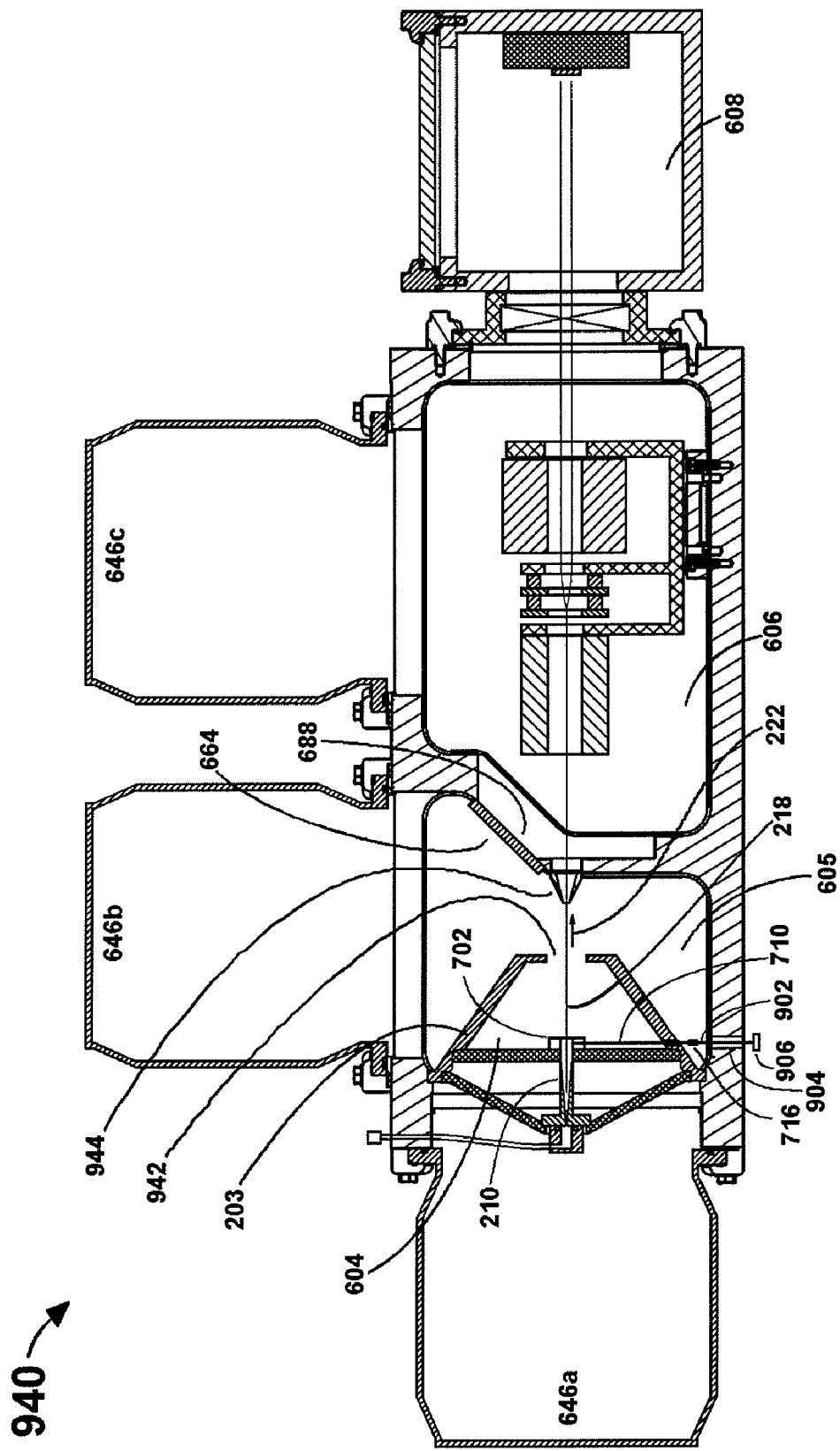
FIG. 11 is a schematic view of another alternative configuration of a GCIB processing system incorporating the improved gas-cluster-jet generator of the second embodiment of the invention.

FIG. 11 is a schematic view of a third configuration of a GCIB processing system 940 including the improved gas-cluster-jet generator of the second embodiment of the invention. In this configuration, there is no skimmer (as previously shown as item 220 in FIG. 9) at the exit of the source chamber 604. Referring again to FIG. 11, instead a skimmer 944 is located at the exit of the intermediate chamber 605. An opening 942 in the source chamber 604 facilitates passage of the gas-cluster-jet along the gas-cluster-jet trajectory 218 from the source chamber 604 to the intermediate chamber 605. A first control shaft 902 connects with the first steering shaft 710 via first control shaft coupler 716. First control shaft 902 passes through a first rotary motion vacuum feedthrough 904 and has attached a first control shaft adjustment knob 906 for adjusting the longitudinal motion of first steering shaft 710 to control the alignment of nozzle 210 (and thus the gas-cluster-jet trajectory 218) with respect to gas skimmer 944 and other downstream beamline components. Like (not visible in this view) elements connected with second steering shaft 810 (not visible in this view) provide for adjusting the longitudinal motion of second steering shaft 810 and thus for controlling the alignment of nozzle 210 in an orthogonal direction.

Figure 12:
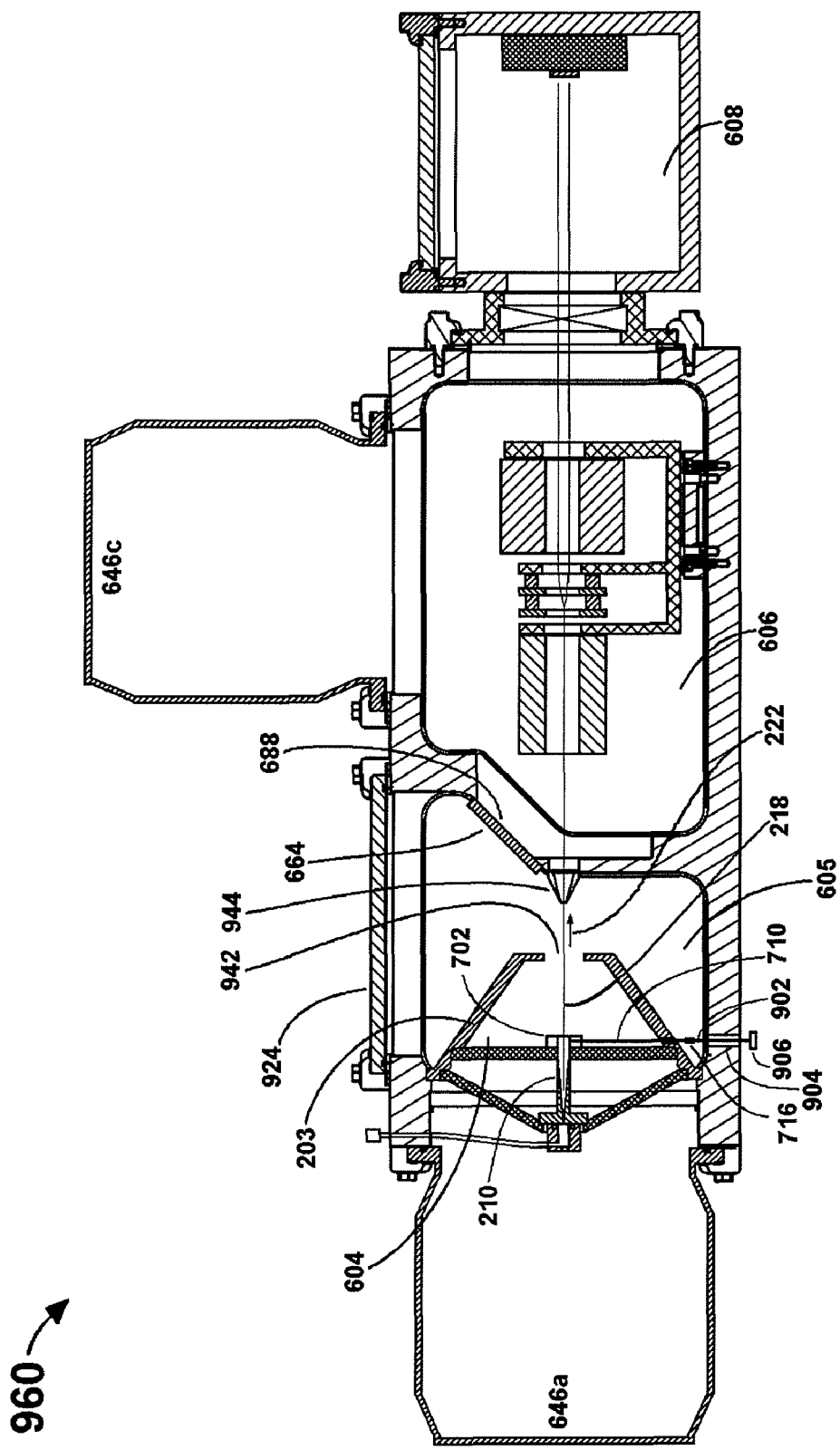
FIG. 12 is a schematic view of yet another alternative configuration of a GCIB processing system incorporating the improved gas-cluster-jet generator of the second embodiment of the invention.

FIG. 12 is a schematic view of a fourth configuration of a GCIB processing system 960 including the improved gas-cluster-jet generator of the second embodiment of the invention. This fourth configuration is like the third configuration (as previously shown in FIG. 11) except that no intermediate chamber vacuum pump (as previously shown as item 646b in FIG. 11) is employed in this configuration. Referring again to FIG. 12, a blank-off plate 924 seals the intermediate chamber 605 from atmospheric pressure. Thus the intermediate chamber 605 is evacuated primarily by the source chamber vacuum pump 646a and may operate at a higher pressure than it does in the configuration shown in FIG. 11. Optionally (not shown), the blank-off plate 664 may be omitted, permitting the beamline chamber vacuum pump 646c to assist in the evacuation of the intermediate chamber 605 through opening 688, permitting the intermediate chamber 605 to operate at lower pressure. By pre-selection of the size of the opening 688 and of the beamline chamber vacuum pump 646c, considerable control of the operating pressure of the intermediate chamber 605 may be obtained. In the configuration of FIG. 12, the cost of an intermediate chamber vacuum pump is eliminated, which is an economic advantage that may be traded off with any gas-cluster-jet intensity reduction resulting from a higher pressure in the intermediate chamber 605.

Figure 13C:
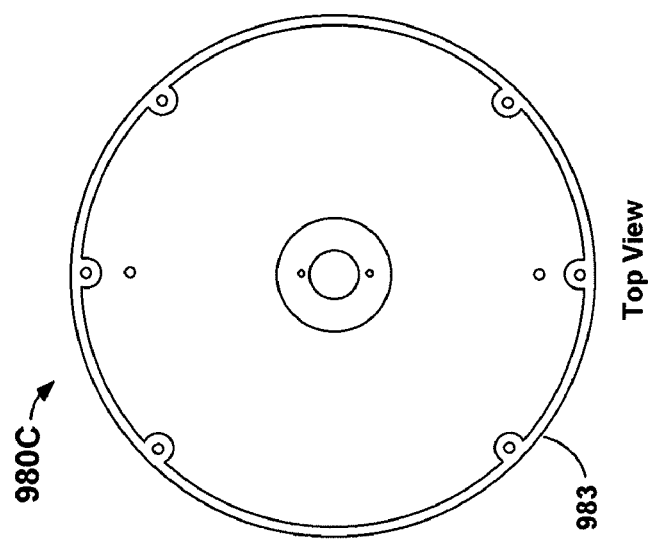
FIGS. 13A, 13B, and 13C are detail views of an alternative shaped vacuum chamber enclosure employed in the improved gas-cluster-jet generator of the invention.
Figure 13B:
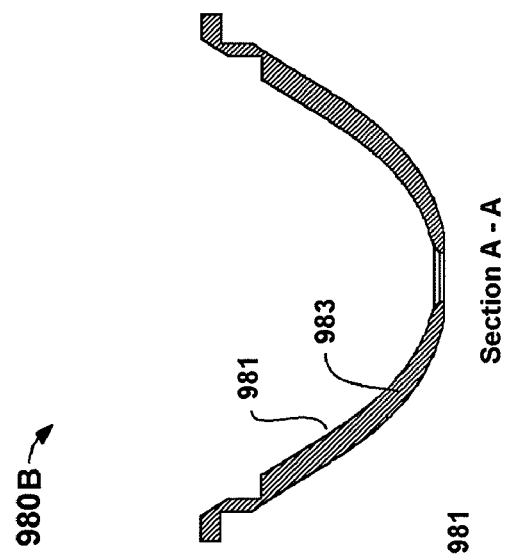
Figure 13A:
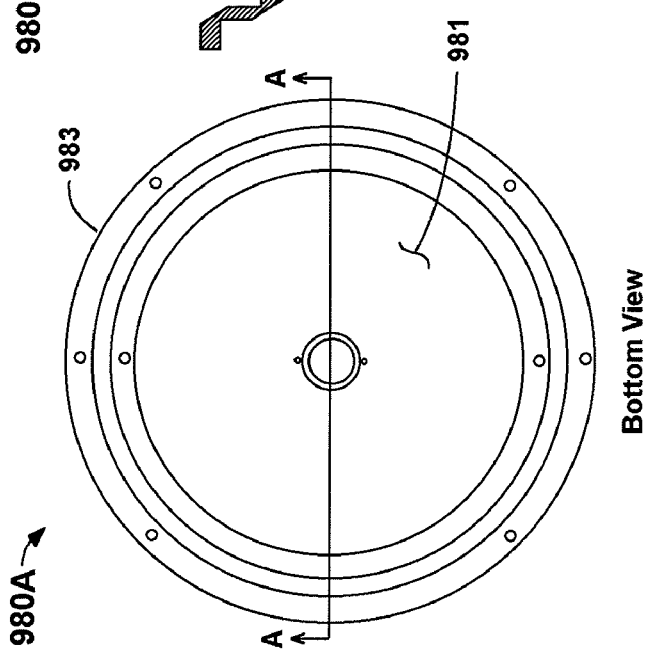

FIGS. 13A, 13B, and 13C are detail views of an alternative shaped gas-cluster-jet generator chamber enclosure 983. FIG. 13A is a bottom view 980A. FIG. 13B is a cross-sectional view 980B. FIG. 13C is a top view 980C. The FIGS. 13A-13B show that the shape of the inner surface 981 of the gas-cluster-jet generator chamber enclosure 983 is substantially a solid, elliptic paraboloid or similar surface of revolution such as an ellipsoid coaxial with the gas-cluster-jet trajectory 218 (of FIG. 2). Though not shown in both forms, the elliptic paraboloid or similar surface of revolution may optionally be truncated by any suitable amount.

Although specific applications of the improved gas-cluster-jet generator has been described employing a conical nozzle, it is understood that alternate nozzle forms, including without limitation, sonic and Laval forms are compatible with the practice of the invention and it is intended that such alternate forms are encompassed within the scope of the invention. Although certain specific examples employing the improved gas-cluster-jet-generator as gas-cluster-jet sources for GCIB apparatuses, it is understood that the invention is applicable to a wide variety of other systems that employ gas-cluster jets, including without limitation, gas-cluster-jet deposition systems and molecular beam epitaxy systems, and it is intended that such other applications are included within the scope of the invention. Although the invention has been described with respect to various embodiments, it should be realized this invention is also capable of a wide variety of further and other embodiments within the spirit and scope of the invention and of the appended claims.

It is claimed:

1. An apparatus for generating a gas-cluster beam, comprising:
   a gas expansion nozzle mounted in a chamber to cause gas clusters from the expansion nozzle to form a beam passing through the chamber in a predetermined direction and through an aperture at an end of the chamber,
   wherein the chamber is formed by one or more surfaces surrounding the beam and aperture and located to deflect gas clusters and molecules from the nozzle that are not traveling within and aligned with the beam away from the beam and towards an opposing predetermined direction.

2. The apparatus of claim 1, wherein the one or more surfaces include a conical first surface coaxially surrounding the beam and angled towards the opposing predetermined direction.

3. The apparatus of claim 2, wherein the one or more surfaces include a second flat surface surrounding the aperture and facing the opposing predetermined direction.

4. The apparatus of claim 1, wherein the one or more surfaces include one or more third surfaces facing away from the beam and located immediately surrounding the beam to deflect gas molecules and clusters traveling at more than a predetermined distance from the beam away from the beam.

5. The apparatus of claim 1, further comprising a vacuum apparatus located behind the expansion nozzle for evacuating deflected gas molecules and clusters that are not part of the beam from the chamber in the opposing predetermined direction.

6. The apparatus of claim 1, wherein the gas expansion nozzle is mounted at opposing input and outlet ends using a limited number of elongated members extending from sides of the chamber to allow easy flow of gas molecules and clusters that are not part of the beam in the opposing predetermined direction.

7. The apparatus of claim 6, wherein the gas expansion nozzle is adjustably mounted at the outlet end of the nozzle to enable adjustment of the predetermined direction.

8. The apparatus of claim 7, wherein the gas expansion nozzle is tiltably mounted at the input end of the nozzle to support adjustment of the predetermined direction at the outlet end of the nozzle.

9. The apparatus of claim 1, wherein the one or more surfaces has substantially the shape of a cone or a pyramid or a elliptic paraboloid or an ellipsoid.

10. The apparatus of claim 1, further comprising a second chamber surrounding the gas cluster beam beyond the aperture and the first said chamber and having a second aperture located for allowing further flow of the gas cluster beam.

11. The apparatus of claim 10, further comprising one or more fourth surfaces facing away from the beam and located immediately surrounding the beam at the second aperture for deflecting gas molecules and clusters traveling at more than a predetermined distance from the beam away from the beam.

12. The apparatus of claim 11, wherein the gas expansion nozzle is mounted at input and outlet ends, and further wherein the outlet end is adjustably mounted to enable adjustment of the predetermined direction.

13. The apparatus of claim 10, wherein the second chamber is formed by at least one plane surface oriented at an angle of from 30° to about 60° with respect to the gas cluster beam and adapted to direct gas molecules and clusters that are not part of the beam away from the beam.

14. The apparatus of claim 1, wherein the one or more surfaces surrounds substantially all of the beam located within the chamber.

15. A gas-cluster ion-beam processing apparatus comprising
   the gas-cluster beam generator apparatus of claim 1 for generating a gas-cluster beam;
   an ionizer for ionizing at least a portion of the gas-cluster beam to form a gas-cluster ion-beam having a path; and
   a workpiece holder for supporting a workpiece in the path of the gas-cluster ion-beam.

16. The gas-cluster ion-beam processing apparatus of claim 15, further comprising a differential pumping chamber having a plane surface oriented at an angle of from about 30 degrees to about 60 degrees with respect to a gas-cluster beam trajectory and adapted to direct at least a portion of un-clustered gas into a vacuum pump.

17. A method for generating a gas-cluster beam, comprising the steps of:
   directing a gas expansion nozzle into a chamber to cause gas clusters from the expansion nozzle to form a beam passing through the chamber in a predetermined direction and through an aperture at an end of the chamber;
   deflecting gas clusters and molecules from the nozzle that are not traveling within and aligned with the beam away from the beam and towards an opposing predetermined direction using walls of the chamber that surround the beam and aperture; and
   creating a vacuum behind the expansion nozzle for evacuating deflected gas molecules and clusters that are not part of the beam from the chamber.

18. The method of claim 17, wherein the step of directing includes adjustably mounting the outlet end of the nozzle and adjusting the predetermined direction.

* * * * *